United States Patent
Lee et al.

(10) Patent No.: US 12,226,748 B2
(45) Date of Patent: Feb. 18, 2025

(54) STIRRER, APPARATUS OF MANUFACTURING QUANTUM DOT INCLUDING THE SAME, AND METHOD OF MANUFACTURING QUANTUM DOT USING THE QUANTUM DOT MANUFACTURING APPARATUS

(71) Applicant: Samsung Display Co., Ltd., Yongin-si (KR)

(72) Inventors: Donghee Lee, Hwaseong-si (KR); Chul Soon Park, Hwaseong-si (KR); Junghoon Song, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 906 days.

(21) Appl. No.: 17/236,985

(22) Filed: Apr. 21, 2021

(65) Prior Publication Data
US 2022/0072502 A1     Mar. 10, 2022

(30) Foreign Application Priority Data

Sep. 7, 2020   (KR) ........................ 10-2020-0113972

(51) Int. Cl.
| | |
|---|---|
| *B01J 19/12* | (2006.01) |
| *B01F 33/452* | (2022.01) |
| *B01F 35/95* | (2022.01) |
| *B01J 19/00* | (2006.01) |
| *H01F 7/02* | (2006.01) |
| *H05K 9/00* | (2006.01) |
| *B01F 35/90* | (2022.01) |

(Continued)

(52) U.S. Cl.
CPC ........... *B01J 19/126* (2013.01); *B01F 33/452* (2022.01); *B01F 35/95* (2022.01); *B01J 19/0066* (2013.01); *H01F 7/02* (2013.01); *H05K 9/0073* (2013.01); *B01F 2035/99* (2022.01); *B01F 2101/2204* (2022.01); *B01J 2219/089* (2013.01); *B01J 2219/1215* (2013.01); *B01J 2219/1293* (2013.01); *B82Y 30/00* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 7,172,791 B2 | 2/2007 | Treadway et al. | |
| 2011/0182805 A1 | 7/2011 | DeSimone et al. | |

(Continued)

FOREIGN PATENT DOCUMENTS

| | | | |
|---|---|---|---|
| JP | 2010-132906 A | 6/2010 | |
| JP | 5570721 B2 | 8/2014 | |

(Continued)

OTHER PUBLICATIONS

Adi, Wisnu Ari, et al. "Metamaterial: Smart Magnetic Material for Microwave Absorbing Material," IntechOpen, © 2019, 18 pages; https://www.intechopen.com/books/electromagnetic-fields-and-waves/metamaterial-smart-magnetic-material-for-microwave-absorbing-material.

*Primary Examiner* — Hsien Ming Lee
(74) *Attorney, Agent, or Firm* — Lewis Roca Rothgerber Christie LLP

(57) ABSTRACT

A stirrer includes a magnetic bar and a microwave absorbing layer around the magnetic bar. The stirrer absorbs a microwave and converts the microwave to thermal energy to heat the mixed solution reactant.

10 Claims, 5 Drawing Sheets

(51) Int. Cl.
  *B01F 101/00* (2022.01)
  *B82Y 30/00* (2011.01)
  *B82Y 40/00* (2011.01)

(56) References Cited

U.S. PATENT DOCUMENTS

| | | | |
|---|---|---|---|
| 2013/0048922 | A1 | 2/2013 | Zhou et al. |
| 2017/0218268 | A1 | 8/2017 | Pickett et al. |
| 2019/0382655 | A1 | 12/2019 | Kuwana et al. |
| 2021/0017469 | A1* | 1/2021 | Hsieh .................. C11B 9/025 |
| 2021/0229060 | A1* | 7/2021 | Lee .................. C01B 25/088 |

FOREIGN PATENT DOCUMENTS

| | | |
|---|---|---|
| KR | 10-2017-0007641 A | 1/2017 |
| KR | 10-1813688 B1 | 12/2017 |
| KR | 10-2019-0096330 A | 8/2019 |
| KR | 20210097254 A | 8/2021 |

* cited by examiner

STIRRER, APPARATUS OF MANUFACTURING QUANTUM DOT INCLUDING THE SAME, AND METHOD OF MANUFACTURING QUANTUM DOT USING THE QUANTUM DOT MANUFACTURING APPARATUS

CROSS-REFERENCE TO RELATED APPLICATION

This application claims priority to and the benefit of Korean Patent Application No. 10-2020-0113972, filed on Sep. 7, 2020 in the Korean Intellectual Property Office (KIPO), the entire content of which is incorporated by reference herein.

BACKGROUND

1. Field

The present disclosure relates to a stirrer, a quantum dot manufacturing apparatus including the same, and a quantum dot manufacturing method using the same. More particularly, the present disclosure relates to a stirrer that absorbs a microwave, a quantum dot manufacturing apparatus including the stirrer, and a quantum dot manufacturing method using the quantum dot manufacturing apparatus.

2. Description of the Related Art

Various types of display devices that are applied to multimedia devices, such as television sets, mobile phones, tablet computers, navigation units, game units, or the like, are being developed. The display devices employ a so-called self-emissive display element that displays images by emitting a light emitting material containing an organic compound.

In addition, a light emitting element that employs a quantum dot as its light emitting material to improve a color reproducibility of the display device is being developed, and a method of effectively manufacturing and producing the quantum dot is desirable.

SUMMARY

Aspects of one or more embodiments of the present disclosure are directed towards a stirrer capable of absorbing a microwave.

Aspects of one or more embodiments of the present disclosure are directed towards a quantum dot manufacturing apparatus including the stirrer that absorbs the microwave.

Aspects of one or more embodiments of the present disclosure are directed towards a quantum dot manufacturing method using the quantum dot manufacturing apparatus.

Embodiments of the present disclosure provide a stirrer including a magnetic bar and a microwave absorbing layer around (e.g., surrounding) the magnetic bar.

The microwave absorbing layer includes at least one of a metal oxide of perovskite structure, a metal oxide of spinel ferrite structure, or a metal oxide of hexagonal ferrite structure.

The microwave absorbing layer includes at least one of $LaMnO_3$, $BaCO_3$, $Fe_2CO_3$, $MnCO_3$, $NiFe_2SO_4$, $BaFe_2O_4$, or $BaFe_{12}O_{19}$.

The microwave absorbing layer includes a plurality of sub-microwave absorbing layers.

The plurality of sub-microwave absorbing layers includes a first sub-microwave absorbing layer around the magnetic bar and a second sub-microwave absorbing layer around (e.g., surrounding) the first sub-microwave absorbing layer. The first sub-microwave absorbing layer and the second sub-microwave absorbing layer include different metal oxides from each other.

Embodiments of the present disclosure provide a quantum dot manufacturing apparatus including a reaction furnace to accommodate a mixed solution including a cationic precursor, an anionic precursor, and an organic solvent, a stirrer in the reaction furnace, and a microwave generator to provide a microwave to be transmitted through the reaction furnace. The stirrer includes a magnetic bar and a microwave absorbing layer around (e.g., surrounding) the magnetic bar.

The microwave absorbing layer includes at least one of a metal oxide of perovskite structure, a metal oxide of spinel ferrite structure, or a metal oxide of hexagonal ferrite structure.

The microwave absorbing layer includes at least one of $LaMnO_3$, $BaCO_3$, $Fe_2CO_3$, $MnCO_3$, $NiFe_2SO_4$, $BaFe_2O_4$, or $BaFe_{12}O_{19}$.

A loss tangent of the mixed solution is smaller than a loss tangent of the microwave absorbing layer (e.g., the mixed solution is smaller in loss tangent than the microwave absorbing layer).

The organic solvent includes at least one of an octadecene or a trioctylphosphine.

The microwave has an energy equal to or greater than about 260 W.

Embodiments of the present disclosure provide a quantum dot manufacturing method including providing a cationic precursor, an anionic precursor, and an organic solvent, stirring the cationic precursor, the anionic precursor, and the organic solvent utilizing a stirrer to manufacture a mixed solution, and supplying a microwave to heat the mixed solution. The heating of the mixed solution includes supplying the microwave to the stirrer to heat the stirrer and heating the mixed solution utilizing the heated stirrer.

The stirrer includes a magnetic bar and a microwave absorbing layer on the magnetic bar. The heating of the stirrer includes allowing the microwave absorbing layer to absorb the microwave.

The microwave has an energy equal to or greater than about 260 W.

The heating of the mixed solution includes heating the mixed solution to a temperature equal to or greater than about 250° C. and equal to or smaller than about 300° C.

According to the above, as the stirrer includes the microwave absorbing layer, the stirrer absorbs the microwave and is heated.

The quantum dot manufacturing apparatus includes the stirrer that absorbs the microwave to be heated, and thus, a temperature of the mixed solution including cationic precursors and anionic precursors increases (e.g., quickly increases). Accordingly, the quantum dot in a short wavelength range may be synthesized (e.g., synthesized in large quantities).

The quantum dot manufacturing method includes the heating of the mixed solution that includes cationic precursors and anionic precursors utilizing the stirrer heated by absorbing the microwave, and thus, the quantum dot in the short wavelength range may be synthesized (e.g., synthesized in large quantities).

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
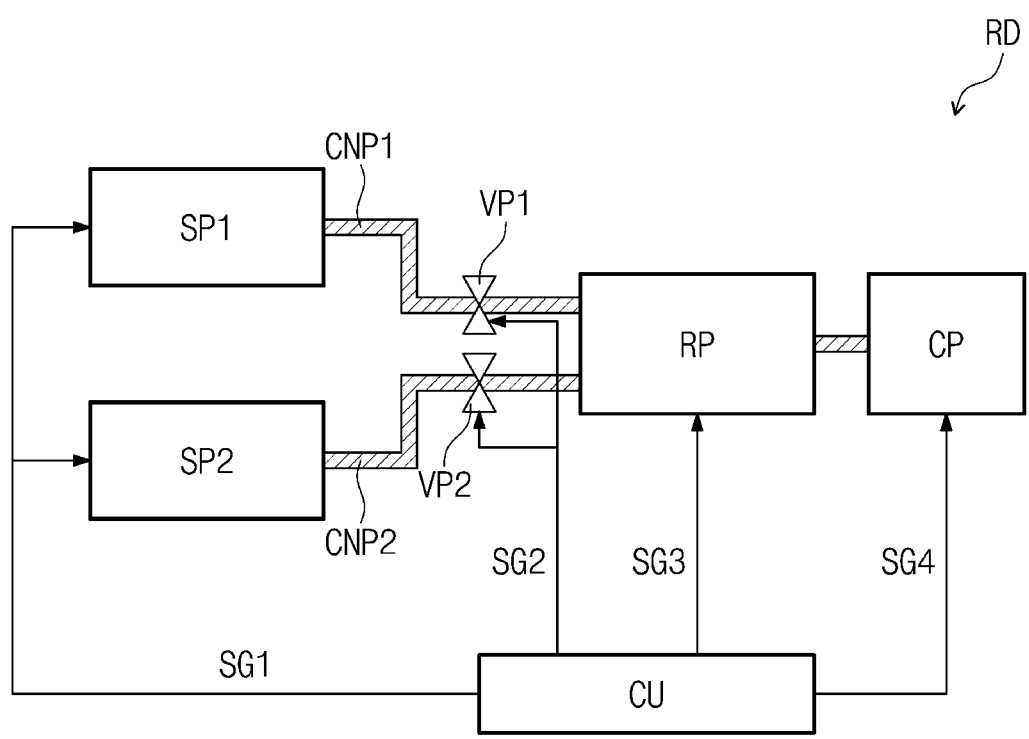
FIG. 1 is a view showing a quantum dot manufacturing apparatus according to an embodiment of the present disclosure.

The present disclosure may be variously modified in a suitable manner and realized in many different forms, and thus specific embodiments will be exemplified in the drawings and described in more detail hereinbelow. However, the present disclosure should not be limited to the specific disclosed forms, and should be construed to include all modifications, equivalents, or replacements included in the spirit and scope of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Meanwhile, in the present disclosure, when an element is referred to as being "directly connected" to another element, there are no intervening elements present between a layer, film region, or substrate and another layer, film, region, or substrate. For example, the term "directly connected" may mean that two layers or two members are disposed without employing additional adhesive therebetween.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

As used herein, expressions such as "at least one of," "one of," and "selected from," when preceding a list of elements, modify the entire list of elements and do not modify the individual elements of the list.

Further, the use of "may" when describing embodiments of the present disclosure refers to "one or more embodiments of the present disclosure".

As used herein, the terms "use," "using," and "used" may be considered synonymous with the terms "utilize," "utilizing," and "utilized," respectively.

Hereinafter, a stirrer, a quantum dot manufacturing apparatus including the stirrer, and a quantum dot manufacturing method using the quantum dot manufacturing apparatus will be explained in more detail with reference to the accompanying drawings.

Figure 2:
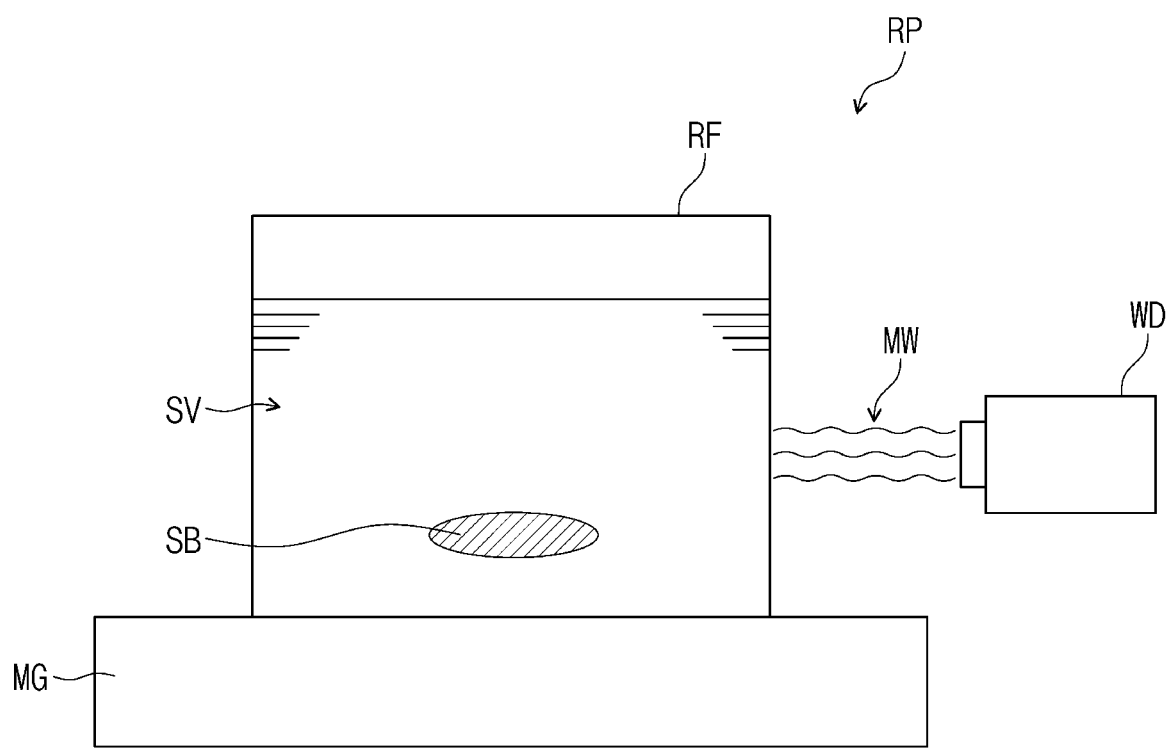
FIG. 2 is a view showing a reaction unit included in a quantum dot manufacturing apparatus according to an embodiment of the present disclosure.
Figure 3:
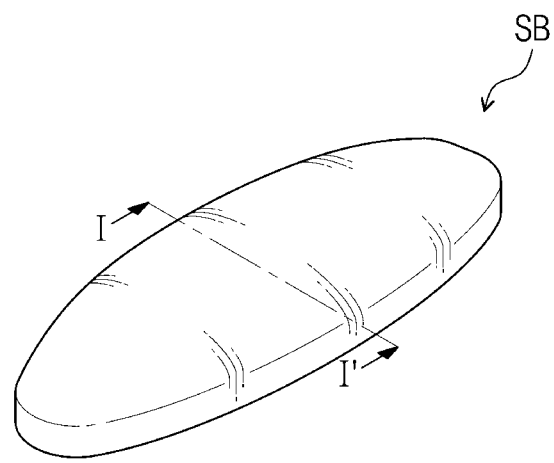
FIG. 3 is a perspective view showing a stirrer included in a quantum dot manufacturing apparatus according to an embodiment of the present disclosure.
Figure 3:
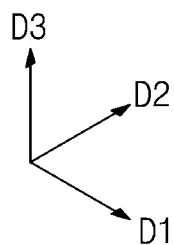
Figure 4:
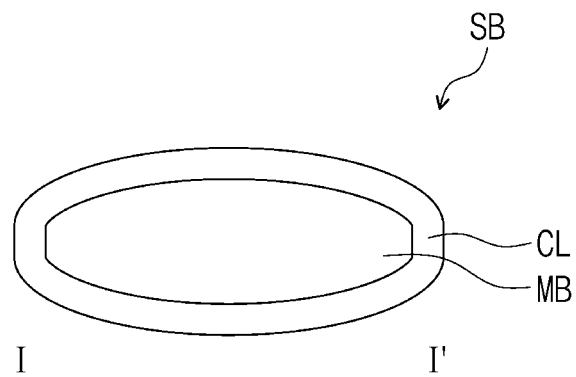
FIG. 4 is a cross-sectional view taken along the line I-I' of FIG. 3 to show the stirrer according to an embodiment of the present disclosure.
Figure 4:
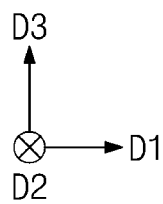

FIG. 1 is a view showing a quantum dot manufacturing apparatus RD according to an embodiment of the present disclosure. FIG. 2 is a view showing a reaction unit RP included in the quantum dot manufacturing apparatus RD according to an embodiment of the present disclosure. FIG. 3 is a perspective view showing a stirrer SB included in the quantum dot manufacturing apparatus according to an embodiment of the present disclosure. FIG. 4 is a cross-sectional view taken along the line I-I' of FIG. 3 to show the stirrer SB according to an embodiment of the present disclosure.

Referring to FIG. 1, the quantum dot manufacturing apparatus RD may include a first supply unit SP1 supplying a cationic precursor, a second supply unit SP2 supplying an anionic precursor, a reaction unit RP connected to the first supply unit SP1 and the second supply unit SP2. A cooling unit CP may be disposed at an end of the reaction unit RP. In one or more embodiments, the cooling unit CP may be connected to the reaction unit RP. In addition, the quantum dot manufacturing apparatus RD may include a control unit CU controlling an operation of the first and second supply units SP1 and SP2 and the reaction unit RP. The control unit CU may also control an operation of the cooling unit CP.

The cationic precursor stored in the first supply unit SP1 and provided to the reaction unit RP by the first supply unit SP1 may include at least one of In, Ga, or Al. In ions, Ga ions, and/or Al ions may be dispersed in an octadecene solvent in the form of a salt. For example, In may be provided in the octadecene solvent in the form of $In(OA)_3$ and Ga may be provided in the octadecene solvent in the form of $Ga(OA)_3$. As used herein, "OA" may refer to oleic acid.

The anionic precursor stored in the second supply unit SP2 and provided to the reaction unit RP by the second supply unit SP2 may include at least one of P, As, N, or Sb. P ions, As ions, N ions, and/or Sb ions may be dispersed in a trioctylphosphine solvent in the form of a salt. For example, a P element may be provided in the trioctylphosphine solvent in the form of $P(TMS)_3$. As used herein, "TMS" may refer to trimethylsilyl.

However, a method of supplying the cationic precursor and the anionic precursor should not be limited to the above supplying method except that the cationic precursor and the anionic precursor are supplied from different supply units separated from or spaced from each other. The cationic precursor and the anionic precursor may be provided in other suitable organic solvents rather than the suggested organic solvents and may be provided in the form of other suitable salts.

The first supply unit SP1 and the second supply unit SP2 may control a supply amount of the cationic precursor and the anionic precursor in response to a first control signal SG1 provided from the control unit CU. The cationic precursor provided from the first supply unit SP1 and the anionic precursor provided from the second supply unit SP2 may be provided to the reaction unit RP respectively through the first supply pipe CNP1 and the second supply pipe CNP2. The first supply unit SP1 and the second supply unit SP2 may be connected to the reaction unit RP respectively through the first supply pipe CNP1 and the second supply pipe CNP2. The first and second supply pipes CNP1 and CNP2 may be formed of a material that is opaque and has a high chemical resistance. For example, the first and second supply pipes CNP1 and CNP2 may be formed of a SUS stainless steel material.

Flow rate control units VP1 and VP2 may be disposed between the reaction unit RP and the first and second supply units SP1 and SP2. The flow rate control units VP1 and VP2 may control (e.g., respectively control) the supply amount of the cationic precursor and the anionic precursor provided to the reaction unit RP. The flow rate control units VP1 and VP2 may control a delivery rate of the cationic precursor and the anionic precursor, which are provided to the reaction unit RP from the first and second supply units SP1 and SP2 in response to a second control signal SG2 provided from the control unit CU.

The cationic precursor and the anionic precursor provided from the first and second supply units SP1 and SP2 may be mixed and react with each other in the reaction unit RP to synthesize a quantum dot. The reaction unit RP may stir the cationic precursor and the anionic precursor to mix the cationic precursor with the anionic precursor. The reaction unit RP may be heated to react the cationic precursor with the anionic precursor and to synthesize the quantum dot. The reaction unit RP may be heated to a temperature of about 250° C. to about 300° C. The control unit CU may apply a third control signal SG3 to the reaction unit RP to control a heating rate of the reaction unit RP and a stirring rate of the cationic precursor and the anionic precursor.

The quantum dot manufacturing apparatus RD may include the cooling unit CP. The cooling unit CP may be connected to the reaction unit RP and may be used to quench (e.g., quickly quench) the quantum dot synthesized in the reaction unit RP. The control unit CU may apply a fourth control signal SG4 to the cooling unit CP to control a temperature of the cooling unit CP. The cooling unit CP may quench the quantum dot synthesized in the reaction unit RP to a temperature equal to or greater than about 20° C. and equal to or smaller than about 50° C.

Referring to FIG. 2, the reaction unit RP may include a reaction furnace RF in which a synthesis reaction between the cationic precursor and the anionic precursor occurs, a microwave generator WD providing microwaves MW (e.g., a microwave MW) to the reaction furnace RF, a stirrer SB stirring the cationic precursor and the anionic precursor, and a magnetic field generator MG providing a magnetic field to the reaction furnace RF.

The reaction furnace RF may accommodate the cationic precursor, the anionic precursor, and the organic solvent. The reaction furnace RF may be formed of a material through which microwaves MW (e.g., the microwave MW) may be transmitted. For example, the reaction furnace RF may be formed of glass, quartz, or Teflon. However, the present disclosure should not be limited thereto or thereby. For example, the material for the reaction furnace RF may be any suitable material having chemical resistance against the cationic precursor and the anionic precursor, which are reactants, and through which microwaves MW may be transmitted.

The magnetic field generator MG may generate the magnetic field to rotate the stirrer SB, and thus, the organic solvent, the cationic precursor, and the anionic precursor may be stirred to manufacture a mixed solution SV. The magnetic field generator MG may control an intensity of the magnetic field provided to the reaction furnace RF in response to the third control signal SG3 provided from the control unit CU, and thus, may control a mixing rate of the cationic precursor, the anionic precursor, and the organic solvent.

The microwave generator WD may provide the microwaves MW to the reaction furnace RF to heat the mixed solution SV. When the mixed solution SV is heated, the cationic precursor may react with the anionic precursor, and thus, the quantum dot may be synthesized. The mixed solution SV may be heated to a temperature equal to or greater than about 250° C. and equal to or smaller than about 300° C. The microwave generator WD may control the intensity of the microwaves MW provided to the reaction furnace RF in response to the third control signal SG3 from the control unit CU and may control the heating rate of the mixed solution SV. The intensity of the microwaves MW may be equal to or greater than about 260 W.

Referring to FIGS. 3 and 4, the stirrer SB may include a magnetic bar MB and a microwave absorbing layer CL around (e.g., surrounding or coating) the magnetic bar MB. In one or more embodiments, the microwave absorbing layer CL surrounding the magnetic bar MB may have a thickness smaller than a thickness of the magnetic bar MB.

As the stirrer SB includes the magnetic bar MB with magnetism, the stirrer SB may rotate in response to the magnetic field applied thereto from the outside. When the stirrer SB rotates, the mixed solution SV (refer to FIG. 2) may be stirred in the reaction furnace RF, the temperature of the mixed solution SV (refer to FIG. 2) may become constant, and the distribution of the cationic precursor and the anionic precursor in the mixed solution SV (refer to FIG. 2) may be constant.

The microwave absorbing layer CL may include a metal oxide that absorbs the microwaves MW. The metal oxide may be heated by converting the absorbed microwaves MW into thermal energy. The organic solvent, which is used in the synthesis of quantum dots (e.g., a quantum dot), may have a low loss tangent, and thus, strong or intense microwaves MW may be desired to increase the heating rate. However, in the case where the reaction unit RP includes the stirrer SB coated with the microwave absorbing layer CL having a high loss tangent, the heating rate of the mixed solution SV (refer to FIG. 2) may increase without increasing the strength or intensity of the microwaves MW. For example, even if a volume of the mixed solution SV (refer to FIG. 2) and the strength or intensity of the microwaves MW are fixed, the mixed solution SV (refer to FIG. 2) may be quickly heated and quantum dots (e.g., a quantum dot) may be synthesized having a larger size and a shorter wavelength than quantum dots (e.g., a quantum dot) when the heating rate is lower. In addition, the reaction unit RP may include a large amount of mixed solution SV (refer to FIG. 2) and several stirrers SB and/or a large-sized stirrer SB to produce (e.g., mass produce) large-sized and short-wavelength quantum dots.

The microwave absorbing layer CL may include at least one of a metal oxide of perovskite structure, a metal oxide of spinel ferrite structure, or a metal oxide of hexagonal ferrite structure. The microwave absorbing layer CL may include at least one of $LaMnO_3$, $BaCO_3$, $Fe_2CO_3$, $MnCO_3$, $NiFe_2SO_4$, $BaFe_2O_4$, or $BaFe_{12}O_{19}$.

In one or more embodiments, the quantum dot manufacturing apparatus according to an embodiment may include a plurality of stirrers. For example, the stirrers SB may have different sizes from each other, and thus, the stirrers SB may have different rotation speeds and different heating rates from each other. In addition, microwave absorbing layers CL respectively surrounding the stirrers SB may include different metal oxides and may have different heating rates from each other. Further, some of the stirrers SB may include the microwave absorbing layer CL, and some of the stirrers SB may not include the microwave absorbing layer CL.

Figure 5:
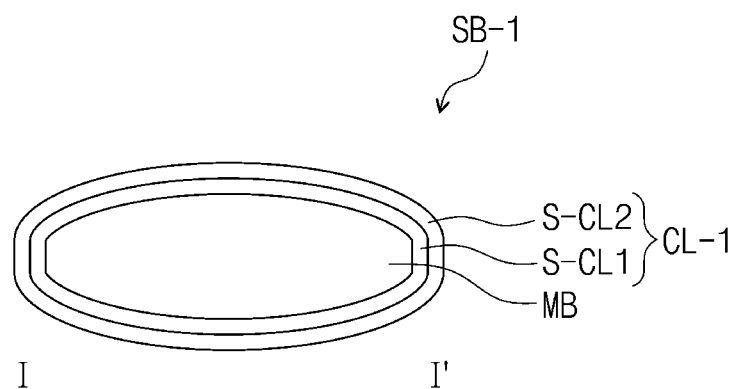
FIG. 5 is a cross-sectional view taken along the line I-I' of FIG. 3 to show a stirrer according to an embodiment of the present disclosure.
Figure 5:
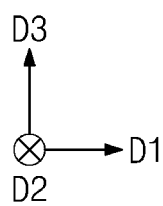

FIG. 5 is a cross-sectional view taken along the line I-I' of FIG. 3 to show a stirrer SB-1 according to an embodiment of the present disclosure. Referring to FIG. 5, the stirrer SB-1 may include a microwave absorbing layer CL-1, and the microwave absorbing layer CL-1 may include a plurality of sub-microwave absorbing layers (e.g., a first sub-microwave absorbing layer S-CL1 and a second sub-microwave absorbing layer S-CL2). The microwave absorbing layer CL-1 may include a first sub-microwave absorbing layer S-CL1 and a second sub-microwave absorbing layer S-CL2. In FIG. 5, the microwave absorbing layer CL-1 includes two sub-microwave absorbing layers (e.g., the first sub-microwave absorbing layer S-CL1 and the second sub-microwave absorbing layer S-CL2), however, the present disclosure should not be limited thereto or thereby. For example, according to an embodiment, the microwave absorbing layer CL-1 may include three or more sub-microwave absorbing layers.

The first sub-microwave absorbing layer S-CL1 and the second sub-microwave absorbing layer S-CL2 may include different metal oxides from each other. Each of the first sub-microwave absorbing layer S-CL1 and the second sub-microwave absorbing layer S-CL2 may include at least one of a metal oxide having perovskite structure, a metal oxide having spinel ferrite structure, or a metal oxide having hexagonal ferrite structure.

Each of the first sub-microwave absorbing layer S-CL1 and the second sub-microwave absorbing layer S-CL2 may include at least one of $LaMnO_3$, $BaCO_3$, $Fe_2CO_3$, $MnCO_3$, $NiFe_2SO_4$, $BaFe_2O_4$, or $BaFe_{12}O_{19}$.

The quantum dots manufactured from the mixed solution SV of the cationic precursor and the anionic precursor, which is provided to the reaction unit RP, may be multi-element compounds containing three or more elements. The quantum dot synthesized and manufactured in the reaction unit RP of the quantum dot manufacturing apparatus RD may include a group II-VI semiconductor compound, a group III-V semiconductor compound, a group III-VI semiconductor compound, a group I-III-VI semiconductor compound, a group IV-VI semiconductor compound, a group IV element, a group IV compound, or any suitable combination thereof.

The group II-VI semiconductor compound may include a binary compound such as Cds, CdSe, CdTe, ZnS, ZnSe, ZnTe, ZnO, HgS, HgSe, HgTe, MgSe, MgS, etc., a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, etc., and a quaternary compound such as CdZnSeS, CdZnSeTe, CdZnSTe, CdHgSeS, CdHgSeTe, CdHgSTe, HgZnSeS, HgZnSeTe, HgZnSTe, etc., or any suitable combination thereof.

The group III-V semiconductor compound may include a binary compound such as GaN, GaP, GaAs, GaSb, AlN, AlP, AlAs, AlSb, InN, InP, InAs, InSb, etc., a ternary compound such as GaNP, GaNAs, GaNSb, GaPAs, GaPSb, AlNP, AlNAs, AlNSb, AlPAs, AlPSb, InGap, InNP, InAlP, InNAs, InNSb, InPAs, InPSb, GaAlNP, etc., and a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, etc., or any suitable combination thereof. In one or more embodiments, the group III-V semiconductor compound may further include a group II element. The group III-V semiconductor compound further including the group II element may include InZnP, InGaZnP, InAlZnP, etc.

The group III-IV semiconductor compound may include a binary compound of GaS, GaSe, $Ga_2Se_3$, GaTe, InS, InSe, $In_2Se_3$, InTe, $In_2S_3$, etc., a ternary compound of $InGaS_3$, $InGaSe_3$, etc., or any suitable combination thereof.

The group I-III-VI semiconductor compound may include a ternary compound of AgInS, $AgInS_2$, CuInS, $CuInS_2$, $CuGaO_2$, $AgGaO_2$, $AgAlO_2$, or any suitable combination thereof.

The group IV-VI semiconductor compound may include a binary compound such as SnS, SnSe, SnTe, PbS, PbSe, PbTe, etc., a ternary compound such as SnSeS, SnSeTe, SnSTe, PbSeS, PbSeTe, PbSTe, SnPbS, SnPbSe, SnPbTe, etc., and a quaternary compound such as SnPbSSe, SnPbSeTe, SnPbSTe, etc., or any suitable combination thereof.

The group IV element or compound may include a mono-element compound such as Si, Ge, etc., a binary compound such as SiC, SiGe, etc., or any suitable combination thereof.

Each element included in the multi-element compounds, such as the binary compound, the ternary compound, and/or the quaternary compound, may exist in particles at a uniform concentration or at a non-uniform concentration.

The quantum dot may have a single structure in which a concentration of each element included in the quantum dot is uniform or a core-shell dual structure. For example, a material included in the core and a material included in the shell may be different from each other.

The shell of the quantum dot may serve as a protective layer to prevent or substantially prevent chemical modification of the core and to maintain semiconductor properties and/or serve as a charging layer to impart electrophoretic properties to the quantum dot. The shell may have a single-layer or multi-layer structure. The interface between the core and the shell may have the concentration gradient in which the concentration of elements existing in the shell decreases as the distance from a center of the core decreases.

In one or more embodiments, the shell of the quantum dot may include one or more oxides of metals or nonmetals, semiconductor compounds, or combinations thereof. For example, the oxides of the metals or nonmetals may be binary elements, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or ternary elements, such as $MgAl_2O_4$, $CoFe_2O_4$, $NiFe_2O_4$, and $CoMn_2O_4$, or any suitable combination thereof. The semiconductor compounds may include the group II-VI semiconductor compound, the group III-V semiconductor compound, the group III-VI semiconductor compound, the group I-III-VI semiconductor compound, a group IV-VI semiconductor compound, or any suitable combinations thereof. For example, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, or any suitable combination thereof.

However, embodiments should not be limited thereto or thereby, and the type of the quantum dot may vary depending on the type of the cationic precursor and anionic precursor, the strength or intensity of the microwaves MW, the volume of the mixed solution SV, and/or the size of the stirrer SB.

Figure 6:
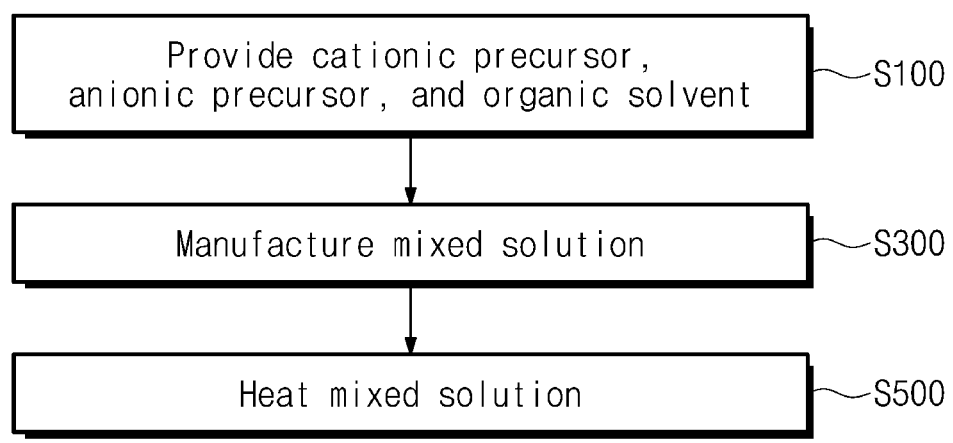
FIG. 6 is a flowchart showing a quantum dot manufacturing method according to an embodiment of the present disclosure.
Figure 7:
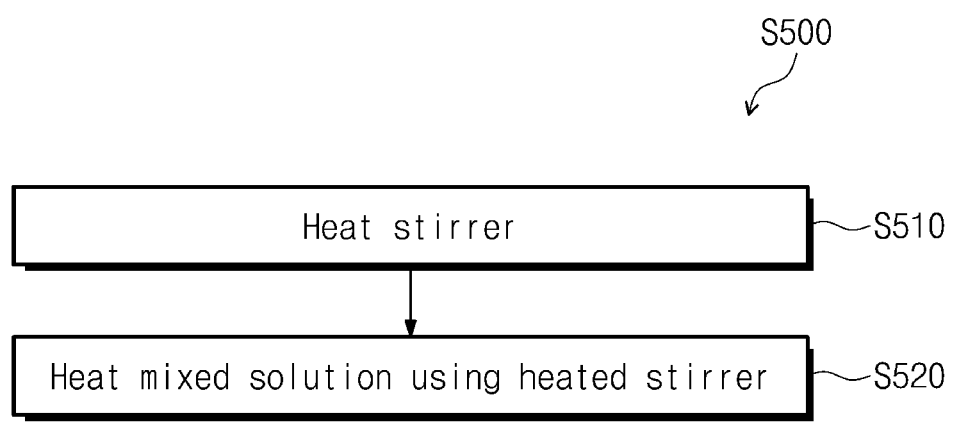
FIG. 7 is a flowchart showing a method of raising a temperature of a mixed solution of a quantum dot manufacturing method according to an embodiment of the present disclosure.

FIG. 6 is a flowchart showing a quantum dot manufacturing method according to an embodiment of the present disclosure, and FIG. 7 is a flowchart showing a method of raising a temperature of the mixed solution of the quantum dot manufacturing method according to an embodiment of the present disclosure. The quantum dot manufacturing method is performed using the above-described quantum dot manufacturing apparatus. Hereinafter, the quantum dot manufacturing method will be described in more detail with reference to FIGS. 2, 6, and 7. Redundant descriptions of the quantum dot manufacturing apparatus and the material for the quantum dot described with reference to FIGS. 1-5 may not be repeated, and characteristics of the quantum dot manufacturing method are described below.

Referring to FIGS. 2 and 6, the quantum dot manufacturing method may include providing the cationic precursor, the anionic precursor, and the organic solvent (S100), stirring the cationic precursor, the anionic precursor, and the organic solvent to manufacture the mixed solution (S300), and heating the mixed solution (S500).

The stirring of the organic solvent including the cationic precursor and the anionic precursor to manufacture the mixed solution (S300) may be performed by the stirrer SB disposed in the reaction furnace RF. The stirrer SB may be magnetic, and thus, the stirrer SB may be rotated by microwaves MW. Due to the rotation of the stirrer SB, the cationic precursor, the anionic precursor, and the organic solvent may be stirred or mixed with each other, and the mixed solution SV may be manufactured. The mixed solution SV may have a uniform or substantially uniform temperature in the reaction furnace RF, and the cationic precursor and the anionic precursor may be uniformly distributed in the mixed solution SV.

The heating of the mixed solution SV (S500) may be performed by applying microwaves MW to the reaction furnace RF to heat the mixed solution SV. The mixed solution SV may be heated to the temperature equal to or greater than about 250° C. and equal to or smaller than about 300° C. The heating of the mixed solution SV (S500) may be concurrently or substantially simultaneously performed with the stirring of the organic solvent including the cationic precursor and the anionic precursor to manufacture the mixed solution (S300) with respect to time.

Referring to FIGS. 2 and 7, the heating of the mixed solution SV in the reaction furnace RF may include supplying microwaves to the stirrer SB to heat the stirrer SB (S510) and heating the mixed solution SV by the heated stirrer SB (S520).

The heating of the stirrer SB (S510) may be performed when the microwave absorbing layer CL (refer to FIG. 4) surrounding the magnetic bar MB (refer to FIG. 4) absorbs one or more microwaves. The heating of the mixed solution SV by the heated stirrer SB (S520) may be performed by the microwave absorbing layer CL (refer to FIG. 4) that heats the mixed solution SV.

As the stirrer includes the microwave absorbing layer, the stirrer may absorb the microwave and may be heated (e.g., heated rapidly).

The quantum dot manufacturing apparatus may include the stirrer that absorbs microwaves, and thus, the quantum dot manufacturing apparatus may heat (e.g., rapidly heat) the mixed solution. Accordingly, quantum dots in the short wavelength range may be synthesized (e.g., synthesized in large quantities) without increasing the intensity of the microwave.

The quantum dot manufacturing method may include heating the mixed solution using the stirrer heated by absorbing the microwave, and thus, the quantum dot in the short wavelength range may be synthesized (e.g., synthesized in large quantities) without increasing the intensity of the microwave.

Although embodiments of the present disclosure have been described, it is understood that the present disclosure should not be limited to these embodiments but various suitable changes and modifications can be made by one ordinary skilled in the art within the spirit and scope of the present disclosure as hereinafter claimed.

Therefore, the disclosed subject matter should not be limited to any single embodiment described herein, and the scope of the present disclosure may be determined according to the attached claims, and equivalents thereof.

What is claimed is:

1. A quantum dot manufacturing apparatus comprising:
a reaction furnace to accommodate a mixed solution comprising a cationic precursor, an anionic precursor, and an organic solvent;
a stirrer in the reaction furnace; and
a microwave generator to provide a microwave to be transmitted through the reaction furnace,
wherein the stirrer comprises:
a magnetic bar; and
a microwave absorbing layer around the magnetic bar.

2. The quantum dot manufacturing apparatus of claim 1, wherein the microwave absorbing layer comprises at least one of a metal oxide of perovskite structure, a metal oxide of spinel ferrite structure, or a metal oxide of hexagonal ferrite structure.

3. The quantum dot manufacturing apparatus of claim 1, wherein the microwave absorbing layer comprises at least one of $LaMnO_3$, $BaCO_3$, $Fe_2CO_3$, $MnCO_3$, $NiFe_2SO_4$, $BaFe_2O_4$, or $BaFe_{12}O_{19}$.

4. The quantum dot manufacturing apparatus of claim 1, wherein a loss tangent of the mixed solution is smaller than a loss tangent of the microwave absorbing layer.

5. The quantum dot manufacturing apparatus of claim 1, wherein the organic solvent comprises at least one of an octadecene or a trioctylphosphine.

6. The quantum dot manufacturing apparatus of claim 1, wherein the microwave has an energy equal to or greater than about 260 W.

7. A quantum dot manufacturing method, the method comprising:
providing a cationic precursor, an anionic precursor, and an organic solvent;
stirring the cationic precursor, the anionic precursor, and the organic solvent utilizing a stirrer to manufacture a mixed solution; and
supplying a microwave to heat the mixed solution, the heating of the mixed solution comprising:
supplying the microwave to the stirrer to heat the stirrer; and
heating the mixed solution utilizing the heated stirrer.

8. The quantum dot manufacturing method of claim 7, wherein the stirrer comprises:
a magnetic bar; and
a microwave absorbing layer on the magnetic bar, and
wherein the heating of the stirrer comprises allowing the microwave absorbing layer to absorb the microwave.

9. The quantum dot manufacturing method of claim 7, wherein the microwave has an energy equal to or greater than about 260 W.

10. The quantum dot manufacturing method of claim 7, wherein the heating of the mixed solution comprises heating the mixed solution to a temperature equal to or greater than about 250° C. and equal to or smaller than about 300° C.

* * * * *